United States Patent
Yamada

(10) Patent No.: US 6,716,694 B2
(45) Date of Patent: Apr. 6, 2004

(54) SEMICONDUCTOR DEVICES AND METHODS FOR MANUFACTURING SEMICONDUCTOR DEVICES

(75) Inventor: Kenji Yamada, Nakata (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 09/947,606

(22) Filed: Sep. 6, 2001

(65) Prior Publication Data

US 2002/0061619 A1 May 23, 2002

(30) Foreign Application Priority Data

Sep. 6, 2000 (JP) ........................................ 2000-270683

(51) Int. Cl.[7] ........................................... H01L 21/8242
(52) U.S. Cl. ...................... 438/239; 438/393; 438/238; 438/266
(58) Field of Search ................... 438/239, 266, 438/393, 238, 186; 257/314, 315, 318

(56) References Cited

U.S. PATENT DOCUMENTS 6,339,000 B1 * 1/2002 Bhattacharya et al. ...... 438/261
6,395,590 B1 * 5/2002 Leu ............................ 438/186

FOREIGN PATENT DOCUMENTS

JP 2000-216274 8/2000

OTHER PUBLICATIONS

Gary E. McGuire, "Semiconductor Materials and Process Technology Handbook," Noyes Publ., Norwich, New York, (1988) p. 303.*

Arthur Sherman, "Chemical Vapor Deposition for Microelectronics," Noyes Publ., Westwood, New Jersey, (1987), p. 68.*

S. Wolf, "Silicon Processing fror the VLSI Era: vol. 2—Process Integration," Lattice Press, Sunset Beach, CA (1990), pp. 20–22.*

* cited by examiner

Primary Examiner—Eddie Lee
Assistant Examiner—Thomas Magee
(74) Attorney, Agent, or Firm—Konrad Raynes & Victor, LLP; Alan S. Raynes

(57) ABSTRACT

A method for manufacturing a semiconductor device that mix mounts non-volatile memories and analog IC's may include the steps of: (a) forming a gate insulation layer 20, a floating gate 22, and a selective oxide insulation layer 24 on a semiconductor substrate 10; (b) forming an insulation layer 12 and a lower electrode 32 that composes a capacitor 300; (d) forming, in a capacitor region 3000, an insulation layer 31 by thermally oxidizing an upper surface section of the lower electrode 32; and (f) forming an intermediate insulation layer 26 and a control gate 23 that form a memory transistor 200, and a dielectric layer 30 and an upper electrode 34 that form the capacitor 300.

19 Claims, 16 Drawing Sheets

SEMICONDUCTOR DEVICES AND METHODS FOR MANUFACTURING SEMICONDUCTOR DEVICES

Applicant hereby incorporates by reference Japanese Application No. 2000-270683, filed Sep. 6, 2000, in its entirety.

TECHNICAL FIELD

The present invention relates to semiconductor devices and methods for manufacturing the same, and more particularly to semiconductor devices that mix-mount non-volatile semiconductor memory devices and semiconductor devices for an analog circuit, and methods for manufacturing the same.

BACKGROUND

In recent years, a mixed-mounting of various circuits is required in view of various demands such as a shortened chip-interface delay, a lowered cost per circuit board, a lowered cost in design and development of a circuit board and the like. A mixed-mounting technology for mounting memories and analog ICs has become one of the important technologies.

SUMMARY

Certain embodiments relate to a method for manufacturing a semiconductor device including a memory region including a non-volatile memory transistor with a split gate structure, and a capacitor region including a capacitor. The method includes forming, in the memory region, a gate insulation layer, a floating gate, and a selective oxide insulation layer on a semiconductor substrate, which comprise a portion of the non-volatile memory transistor. In the capacitor region, a lower electrode that comprises a portion of the capacitor on an insulation layer is formed on the semiconductor substrate. The method also includes successively depositing in layers a first silicon oxide layer and a protection layer for the memory region, and then removing, in the capacitor region, the first silicon oxide layer and the protection layer deposited over the lower electrode. In the capacitor region, an insulation layer is formed by thermally oxidizing an upper surface section of the lower electrode. The method also includes depositing a silicon nitride layer, and then removing the protection layer and the silicon nitride layer in the memory region, and patterning the silicon nitride layer in the capacitor region. The method also includes forming an intermediate insulation layer and a control gate that comprise a portion of the non-volatile memory transistor, and forming a dielectric layer and an upper electrode that comprise a portion of the capacitor, wherein the control gate and upper electrode are formed by forming and then patterning a conduction layer, wherein the intermediate insulation layer is formed by patterning the first silicon oxide layer; and wherein the dielectric layer is formed between the upper electrode and the lower electrode. In addition, an impurity diffusion layer is formed by introducing an impurity in a specified region in the semiconductor substrate.

In one aspect of certain embodiments such as that described above, the control gate that forms a portion of the non-volatile memory transistor and the upper electrode that forms a portion of the capacitor are formed in a common patterning step. In another aspect of certain embodiments, the floating gate that forms a portion of the non-volatile memory transistor and the lower electrode that forms a portion of the capacitor are formed in a common patterning step.

Embodiments also include a method for manufacturing a semiconductor device that mix mounts non-volatile memories and analog integrated circuits. The method includes forming, in a memory region, a gate insulation layer, a floating gate, and a selective oxide insulation layer on a semiconductor substrate. The method also includes forming, in a capacitor region, an insulation layer and a lower electrode. In addition, in the capacitor region, an insulation layer is formed by thermally oxidizing an upper surface section of the lower electrode. In addition, in the memory region, an intermediate insulation layer and a control gate are formed. In addition, in the capacitor region, a dielectric layer and an upper electrode are formed. The floating gate and the lower electrode are formed in a common processing step. In an aspect of certain embodiments, the control gate and the upper electrode are formed in a common processing step.

Embodiments also include a method for manufacturing a semiconductor device that mix mounts non-volatile memories and analog integrated circuits, including forming, in a memory region, a gate insulation layer, a floating gate, and a selective oxide insulation layer on a semiconductor substrate. The method also includes forming, in a capacitor region, an insulation layer and a lower electrode on the semiconductor substrate. In addition, the method includes forming a first silicon oxide layer and a protection layer on the selective oxide insulation layer in the memory region. The method also includes forming, in the capacitor region, an insulation layer by thermally oxidizing an upper surface section of the lower electrode. In addition, in the memory region, an intermediate insulation layer and a control gate are formed, and in the capacitor region, a dielectric layer and an upper electrode are formed. In on aspect of certain embodiments, the protection layer comprises silicon nitride.

Embodiments also include a semiconductor device including non-volatile memories and analog integrated circuits formed on a substrate. The device includes a memory region including a gate insulation layer, a floating gate, and a selective oxide insulation layer on a semiconductor substrate. The device also includes a capacitor region including an insulation layer and a lower electrode on the semiconductor substrate. The memory region also includes a first silicon oxide layer and a protection layer on the selective oxide insulation layer. The capacitor region also includes a thermally oxidized insulation layer on an upper surface section of the lower electrode. The device also includes an intermediate insulation layer and a control gate in the memory region, and a dielectric layer and an upper electrode in the capacitor region. In one aspect of certain embodiments, the protection layer comprises silicon nitride.

BRIEF DESCRIPTION OF THE DRAWINGS

Embodiments of the invention are described with reference to the accompanying drawings which, for illustrative purposes, are schematic and not necessarily drawn to scale.

DETAILED DESCRIPTION

Figure 1:
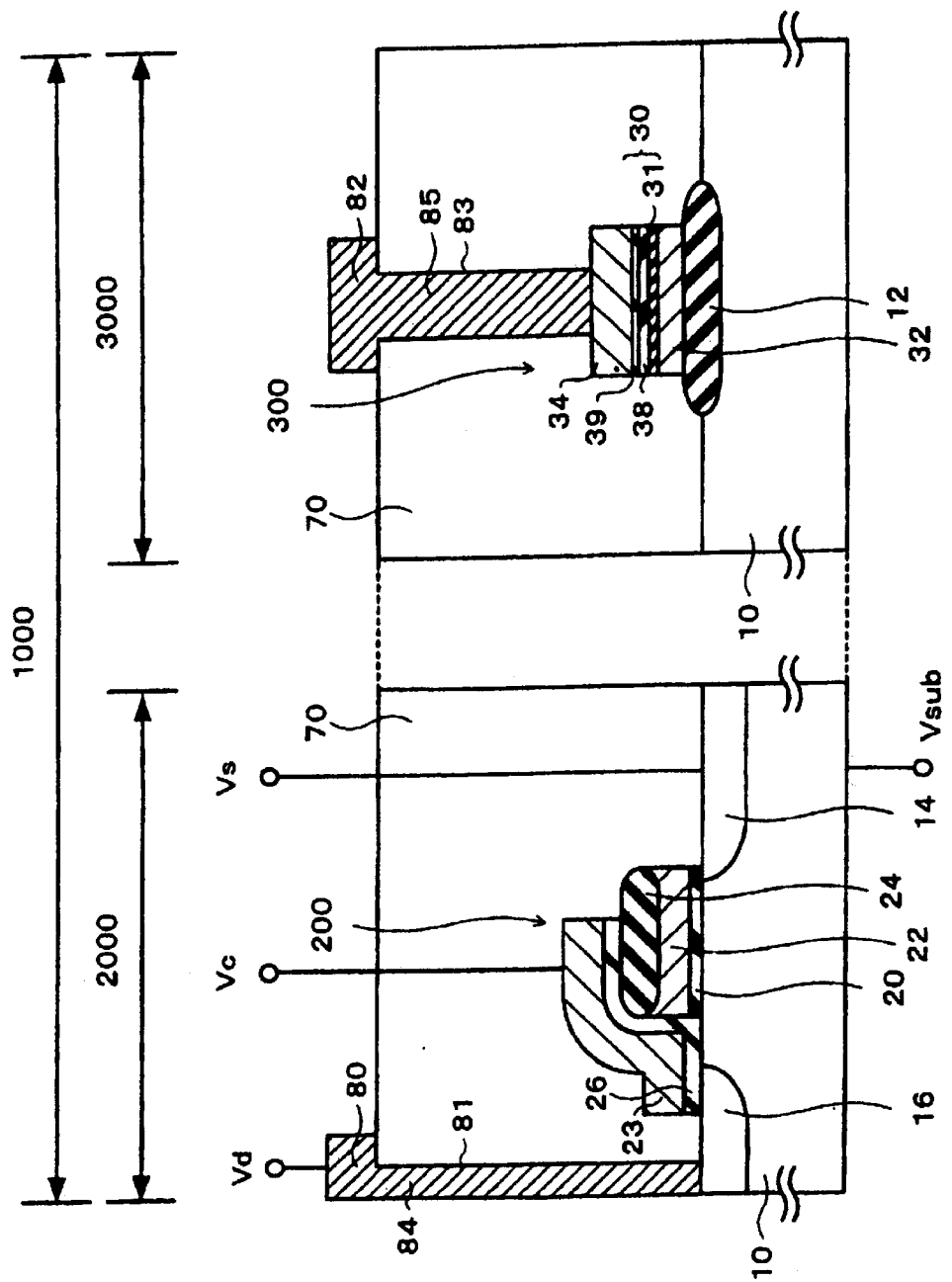
FIG. 1 schematically shows a cross-sectional view of a semiconductor device in accordance with one embodiment of the present invention.

In general, the manufacturing process is often complex for manufacturing semiconductor devices of a mixed-mounting type, and therefore it is often difficult to simplify the manufacturing process and therefore it is difficult to reduce the manufacturing cost.

Furthermore, in the mixed-mounting technology, in manufacturing processes for manufacturing memories and analog ICs, the manufacturing process for devices of one of the types may affect the device characteristic of the other of the types. This makes it more difficult to simplify the manufacturing process for manufacturing mixed-mounting type semiconductor devices.

Certain embodiments of the present invention provide a highly reliable semiconductor device of the type that mix-mounts non-volatile memories and analog ICs, which can be manufactured with a fewer steps, and a method for manufacturing the same.

Certain embodiments of the present invention relate to a method for manufacturing a semiconductor device including a memory region including a non-volatile memory transistor with a split gate structure, a capacitor region including a capacitor, the method for manufacturing a semiconductor device comprising the steps of:

(a) forming, in the memory region, a gate insulation layer, a floating gate, and a selective oxide insulation layer on a semiconductor substrate, which form the non-volatile memory transistor;

(b) forming, in the capacitor region, a lower electrode that forms the capacitor on the insulation layer formed on the semiconductor substrate;

(c) successively depositing in layers a first silicon oxide layer and a protection layer for the memory region, and then removing, in the capacitor region, the first silicon oxide layer and the protection layer deposited in layers over the lower electrode;

(d) forming, in the capacitor region, a insulation layer by thermally oxidizing an upper surface section of the lower electrode;

(e) depositing a silicon nitride layer, and then removing the protection layer and the silicon nitride layer in the memory region, and patterning the silicon nitride layer into a specified shape in the capacitor region;

(f) forming and then patterning a conduction layer to form an intermediate insulation layer and a control gate that form the non-volatile memory transistor, and a dielectric layer and an upper electrode that form the capacitor, wherein the intermediate insulation layer is formed by patterning the first silicon oxide layer into a specified shape, the control gate and the upper electrode are formed by patterning the conduction layer into specified shapes, respectively, and the dielectric layer is formed between the upper electrode and the lower electrode that form the capacitor, and (g) forming an impurity diffusion layer by introducing impurity in a specified region in the semiconductor substrate.

In the present embodiment, the protection layer for a memory region is a layer that is formed to protect the selective oxide insulation layer formed in the memory region and the first silicon oxide layer when the upper surface section of the lower electrode formed in the capacitor region is subject to a thermal oxidation.

Also, the silicon oxide layer is a layer that includes at least silicon oxide, and may include other oxide layers. The silicon nitride layer is a layer that includes at least silicon nitride, and may include other nitride layers.

By the manufacturing method described above, a memory transistor having a split-gate structure and a capacitor can be formed in a series of steps. In other words, a semiconductor device that mix-mounts a non-volatile memory transistor and a capacitor can be manufactured in relatively few steps.

Also, in accordance with the manufacturing method described above, in step (c), the protection layer is preferably formed on the first silicon oxide layer in the memory region, and in step (d), in the capacitor region, an upper surface section of the lower electrode is preferably thermally oxidized to form an insulation layer. In the thermal oxidation step, the first silicon oxide layer and the selective oxide insulation layer formed in the memory region are covered and thus protected by the protection layer, such that the effects of the thermal oxidation that may be inflicted on the first silicon oxide layer and the selective oxide insulation layer can be reduced. In other words, the shape of the first silicon oxide layer and the selective oxide insulation layer can be inhibited or prevented from changing due to the thermal oxidation step. As a result, the effects on the flash memory characteristic can be reduced. In addition, since an intermediate insulation layer with an excellent film characteristic can be obtained, a highly reliable memory characteristic can be realized.

Also, in step (d), since the thermal oxidation is preferably conducted in a state in which the protection layer is formed on the first silicon oxide layer, the first silicon oxide layer is densified and the film quality of the first silicon oxide layer can be improved. Because a non-volatile memory transistor of the present invention includes an intermediate insulation layer composed of the first silicon oxide layer with the good film quality, its memory characteristic, particularly, the number of data writing and erasure operations (cycle life) can be improved.

Preferred embodiments of the method for manufacturing a semiconductor device may include the following examples.

(1) In step (f), the control gate that forms the non-volatile memory transistor and the upper electrode that forms the capacitor can be formed in the same patterning step. The term patterning includes processes for masking or covering a portion of a surface and then performing a processing operation on the uncovered portion of the surface. For example, one known patterning process including forming a resist layer into a specified pattern on a surface and then the exposed portions of the surface (not covered by the resist) are etched. In the manufacturing method described above, by forming the control gate and the upper electrode in a common step, the semiconductor device can be manufactured with fewer steps.

(2) In steps (a) and (b), the floating gate that forms the non-volatile memory transistor and the lower electrode that forms the capacitor can be formed in the same patterning step. In the manufacturing method described above, by forming the floating gate and the lower electrode in a common step, the semiconductor device can be manufactured with fewer steps.

(3) In step (d), the thermal oxidation may be conducted at about 700° C. to 1100° C. to form the insulation layer composed of a silicon oxide layer. By thermally oxidizing the upper surface section of the lower electrode at temperatures set within the aforementioned temperature range, an oxide layer may be formed on the upper surface section of the lower electrode without affecting the memory region.

(4) In step (f), when the conduction layer is formed, an upper surface section of the silicon nitride layer may be oxidized to form a second silicon oxide layer. In this embodiment, the dielectric layer includes a lower dielectric layer, an intermediate dielectric layer and an upper dielectric layer, wherein the lower dielectric layer may be composed of a silicon oxide layer that is formed in step (d), the intermediate dielectric layer may be composed of the silicon nitride layer that is formed in step (e), and the upper dielectric layer may be composed of the second silicon oxide layer that is formed in step (f).

(5) Step (c) may preferably comprise the step of forming a mask layer on the protection film in the memory region and then removing the first silicon oxide layer and the protection layer in the capacitor region.

(6) Step (e) may preferably comprise the step of forming a mask layer in a specified region of the silicon nitride layer in the capacitor region, and then removing the protection layer and the silicon nitride layer in the memory region and patterning the silicon nitride layer in the capacitor region into a specified pattern.

(7) The protection layer may preferably be composed of a silicon nitride layer. In this embodiment, in step (c), the protection layer may preferably be formed to a thickness of 5 to 20 nm.

Also, the method for manufacturing a semiconductor device described above may include at least the step of forming a flash memory. In this embodiment, another circuit region that is mix-mounted may be formed. The other circuit may include at least one circuit among an A-D converter, a D-A converter, a comparator, an operation amplifier and a power supply IC, and the capacitor may be included in the other circuit.

Also, a semiconductor device manufactured as described above may include:

a memory region including a non-volatile memory transistor with a split-gate structure, and a capacitor region including a capacitor, wherein the non-volatile memory transistor includes a source, a drain, a gate insulation layer, a floating gate, an intermediate insulation layer and a control gate, and the capacitor includes a lower electrode, a dielectric layer and an upper electrode. In this embodiment, the floating gate that forms the non-volatile memory transistor and the lower electrode that forms the capacitor may be formed in the same filming forming step.

Certain preferred embodiments of the present invention are described below with reference to the accompanying drawings.

FIG. 1 schematically shows a cross-sectional view of a semiconductor device 1000 including a non-volatile memory transistor 200 in accordance with an embodiment of the present invention. The semiconductor device 1000 includes a memory region 2000 and a capacitor region 3000.

The memory region 2000 includes, as shown in FIG. 1, a non-volatile memory transistor with a split-gate structure (hereinafter referred to as "memory transistor") 200. The capacitor region 3000 includes a capacitor 300. An embodiment example of a circuit in which the capacitor 300 is used will be described below.

The memory transistor 200 and the capacitor 300 are respectively formed in a P-type silicon substrate 10. The memory region 2000 and the capacitor region 3000 are isolated from one another by a field insulation layer.

In the embodiment shown in the figure, the memory transistor 200 and the capacitor 300 are formed in the silicon substrate 10. However, a well may be formed in the silicon substrate 10, and the memory transistor and capacitor may be formed in the well.

The memory region 2000 may also include a P-channel type transistor. However, to simplify the description, only an N-channel type transistor is shown in the figure.

The memory transistor 200 has a source region 14 and a drain region 16 composed of N-type impurity diffusion layers formed in the silicon substrate 10, and a gate insulation layer 20 formed on the silicon substrate 10. A floating gate 22, a selective oxide insulation layer 24, an intermediate insulation layer 26 and a control gate 23 are successively formed on the gate insulation layer 20 in this order from the side closer to the gate insulation layer 20.

The selective oxide insulation layer 24 is formed by selective oxidation on a part of a polycrystal silicon layer 22a (see FIG. 2) that becomes the floating gate 22, as described below, and has a structure in which the thickness thereof becomes thinner from its center toward its end section. As a result, upper edge sections of the floating gate 22 form sharp edges, such that an electric field concentration is apt to occur at the upper edges thereof.

The thickness of the gate insulation layer 20 of the memory transistor 200 is preferably 5–20 nm, in view of the dielectric strength of the memory transistor 200.

The intermediate insulation layer 26 is formed in a manner to continue from the top surface of the selective oxide insulation layer 24 to the side surface of the floating gate 22, further extends along the surface of the silicon substrate 10 and reaches one end of the source region 14. The intermediate insulation layer 26 is preferably formed from a silicon oxide layer. This insulation layer 26 preferably comprises a silicon oxide layer that is formed by a thermal oxidation method and a silicon oxide layer that is formed by a CVD method. Preferably, the silicon oxide layer formed by a CVD method is formed on the silicon oxide layer formed by a thermal oxidation method. When the intermediate insulation layer 26 includes a silicon oxide layer that is formed by a CVD method, advantages are provided. For example, the dielectric strength between the floating gate 22 and the control gate 23 is increased, such that malfunctions in writing in or reading from memory cells, in other words, write disturb and read disturb, can be prevented.

The intermediate insulation layer 26 may preferably have a film thickness of 10–30 nm, in view of its preferred function as a tunnel insulation layer.

The capacitor 300 is formed on the insulation layer 12 formed on the silicon substrate 10, and is formed from a lower electrode 32, a dielectric layer 30 and an upper electrode 34. The insulation layer 12 is formed from, for example, silicon oxide. The lower electrode 32 and the upper electrode 34 are formed from conduction layers, such as, for example, polysilicon. It is noted that, in the present embodiment, the insulation layer 12 is formed by selective oxidation. However, the type and the method of forming the insulation layer 12 are not particularly limited as long as it can sufficiently insulate the silicon substrate 10 from the capacitor 300.

The dielectric layer 30 is formed from a lower dielectric layer 31 that is preferably formed from a silicon oxide layer, an intermediate dielectric layer 38 that is preferably formed from a silicon nitride layer and an upper dielectric layer 39 that is preferably formed from a silicon oxide layer. In other words, the dielectric layer 30 may preferably have a stacked layered structure composed of oxide layer/nitride layer/oxide layer (hereafter referred to as "ONO stacked layered structure"). The ONO stacked layered structure is required when a capacitor is formed. In other words, in the case of a capacitor, an ONO stacked layered structure, in which a nitride layer, such as, for example, a silicon nitride layer is interposed by silicon oxide layers, is generally used in view of its dielectric strength and dielectric constant.

The lower dielectric layer 31 is preferably formed from a silicon oxide layer (insulation layer) formed by a thermal oxidation method. The dielectric layer 30 may preferably have a film thickness of 5 nm to 20 nm in view of the film thickness of the lower electrode 32 and the upper electrode 34.

An interlayer dielectric layer 70 is formed on the silicon substrate 10 where the memory transistor 200 and the capacitor 300 are formed. Contact holes 81 and 83 that reach the drain region 16 and the upper electrode 34 of the capacitor 300, respectively, are formed in the interlayer dielectric layer 70, and contact conduction layers 84 and 85 are formed in the respective contact holes. Furthermore, wiring layers 80 and 82 having specified patterns are formed on the interlayer dielectric layer 70. It is noted that FIG. 1 shows only a part of the contact conduction layers and the wiring layers.

In accordance with the semiconductor device 1000 shown in FIG. 1, the memory transistor 200 in the memory region 2000 can be operated. In the semiconductor device 1000, not only logic for operating a flash EEPROM can be implemented, but also a flash EEPROM and other circuits that are operational at different voltage levels may be mixed and implemented in the same substrate to construct a system LSI. Such circuits include analog circuits, interface circuits, gate array circuits, memory circuits such as RAMs and ROMs and RISCs (reduced instruction set computers), or a variety of IP (Intellectual Property) macro circuits, or other digital circuits.

Next, a method for operating the memory transistor 200, and a method for manufacturing an embedded semiconductor device 5000 in which the semiconductor device 1000 of the present embodiment is applied, and a method for manufacturing the semiconductor device 1000 shown in FIG. 1, are described.

Next, a method for operating the memory transistor 200 that composes the semiconductor device 1000 in accordance with one example of the present embodiment will be described.

For the operation of the memory transistor with a split-gate structure 200, a channel current is supplied between the source region 14 and the drain region 16 to thereby inject a charge (hot electrons) in the floating gate 22 when writing data. When erasing data, a predetermined high voltage is applied to the control gate 23 to thereby transfer the charge stored in the floating gate 22 to the control gate 23 by FN (Fowler-Nordheim) conduction. Each of the operations will be described below.

First, the data-writing operation will be described.

For the data-writing operation, the source region 14 is set at a higher potential with respect to the drain region 16, and a low potential is applied to the control gate 23. As a result, hot electrons that are generated near the drain region 16 are accelerated toward the floating gate 22, and injected in the floating gate 22 through the gate insulation layer 20 to thereby accomplish the write data operation.

In the data-writing operation, for example, the control gate 23 is set at a potential (Vc) of 2 V, the source region 14 is set at a potential (Vs) of 10.5 V, and the drain region 16 is set at a potential (Vd) of 0.8 V. The silicon substrate 10 is set at a potential (Vsub) of 0 V.

Next, the data-erasing operation will be described. For the data-erasing operation, the control gate 23 is set at a potential higher than the potential of the source region 14 and the drain region 16.

As a result, the charge stored in the floating gate 22 is discharged from the sharp upper edge section of the floating gate 22, passing through the intermediate insulation layer 26, to the control gate 23 due to the FN conduction, whereby the data is erased.

In the data-erasing operation, for example, the control gate 23 is set at a potential (Vc) of 11.5 V, the source region 14 and the drain region 16 are set at potentials (Vs) and (Vd) of 0 V, respectively. The silicon substrate 10 is set at a potential (Vsub) of 0 V.

Next, the data-reading operation will be described. For the data-reading operation, the drain region 16 is set at a higher potential than the source region 14, and the control gate 23 is applied with a predetermined potential, whereby a determination is made whether or not data is written based on the presence or the absence of a formed channel. More specifically, when a charge is injected in the floating gate 22, the potential of the floating gate 22 becomes low, with the result that a channel is not formed and a drain current does not flow. In contrast, when the floating gate 22 is not injected with a charge, the floating gate 22 has a high potential, with the result that a channel is formed and a drain current flows. By detecting a current flowing from the drain region 16 by a sense amplifier, data in the memory transistor 200 can be read out.

In the data-reading operation, for example, the control gate 23 is set at a potential (Vc) of 3 V, the source region 14 is set at a potential (Vs) of 0 V, and the drain region 16 is set at a potential (Vd) of 1V. The silicon substrate 10 is set at a potential (Vsub) of 0 V.

The operations described above are examples, and other operation conditions are also applicable in accordance with other embodiments.

Figure 16:
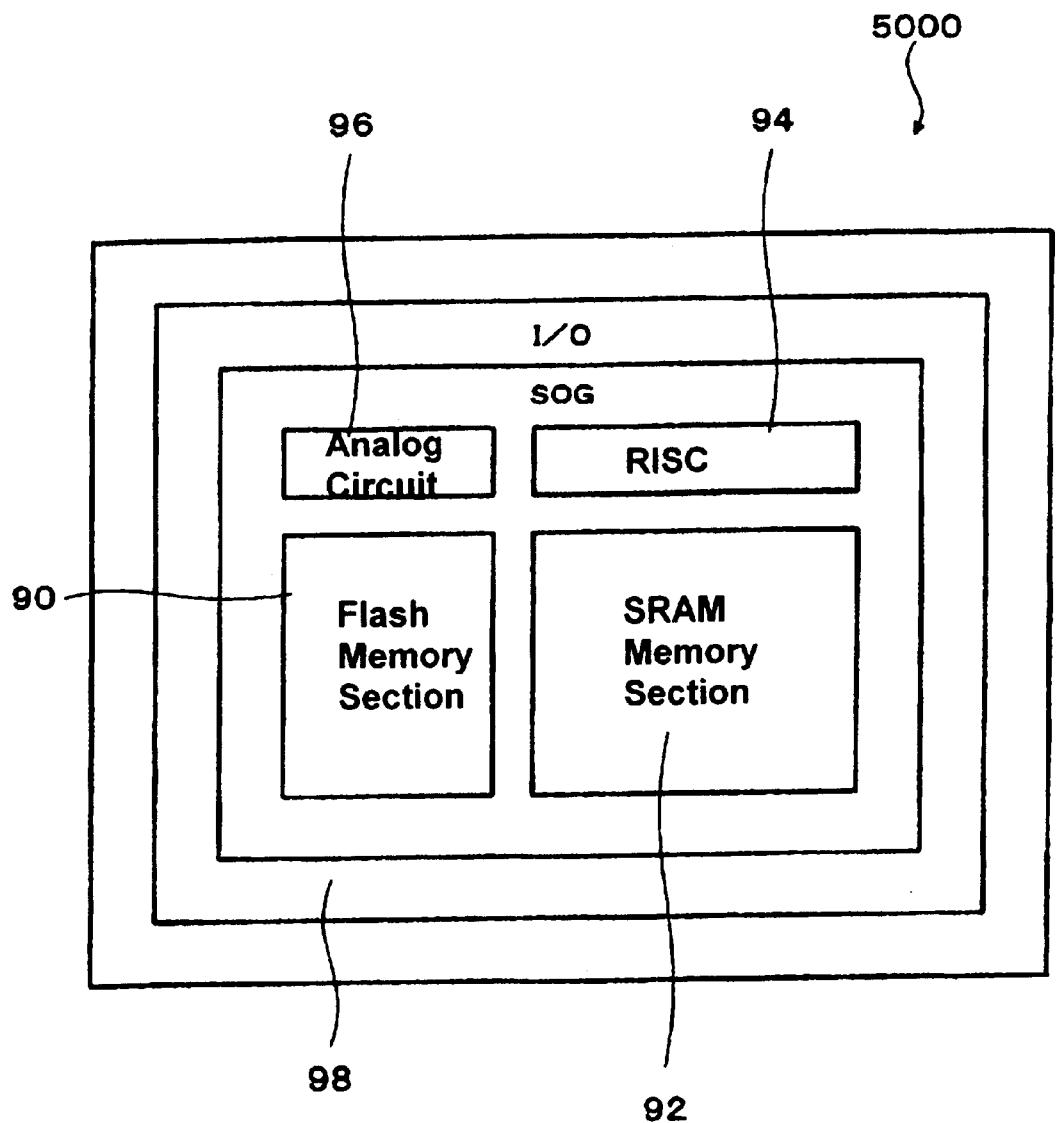
FIG. 16 schematically shows a plan view of one example of an embedded semiconductor device in which a semiconductor device in accordance with an embodiment of the present invention is implemented.

FIG. 16 schematically shows a layout of an embedded semiconductor device 5000 in which the semiconductor device 1000 is implemented. In accordance with this embodiment, the embedded semiconductor device 5000 includes a flash-memory section (flash EEPROM) 90, an SRAM memory section 92, a RISC 94, an analogue circuit section 96 and an interface circuit 98 that are mixed and mounted in an SOG (sea of gates) structure.

In such an embedded semiconductor device 5000, the memory region 2000 that includes the memory transistor 200 shown in FIG. 1 is formed in the flash memory section 90. The capacitor region 3000 that includes the capacitor 300 is formed in the analog circuit section 96. The analog circuit section 96 is composed of analog ICs, such as, for example, A-D converters, D-A converters, comparators, operation amplifiers, power supply ICs and the like. The capacitor 300 is used as a component of the analog ICs.

It is noted that the embedded semiconductor device 5000 shown in FIG. 16 is an example layout, and the present invention is also applicable to a variety of system LSIs.

Next, a method for manufacturing the semiconductor device 1000 shown in FIG. 1 in accordance with one embodiment of the present invention will be described with reference to FIG. 2 through FIG. 12.

Figure 2:
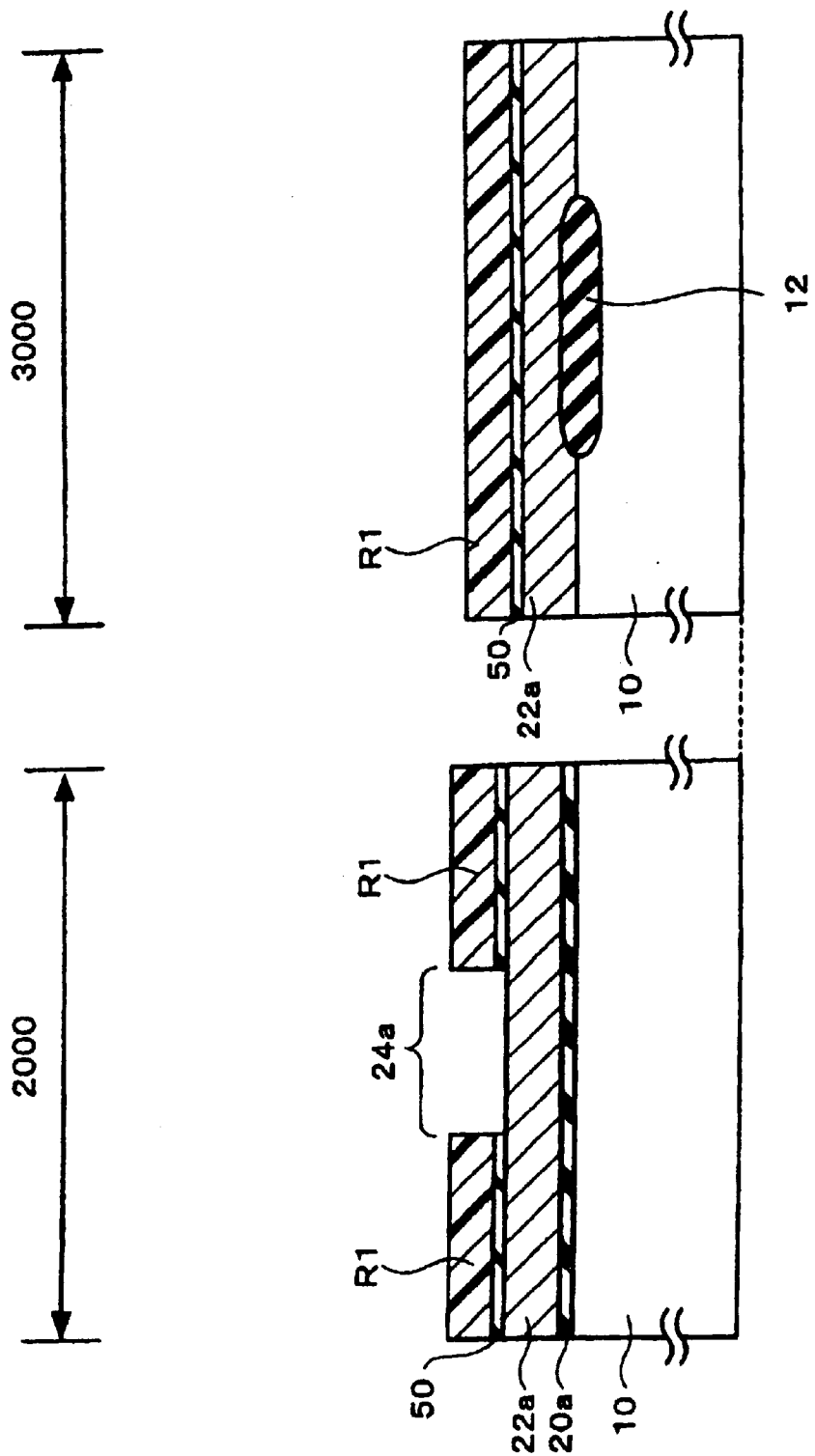
FIG. 2 shows a cross-sectional view of a memory region and a capacitor region in a manufacturing step of the semiconductor device shown in FIG. 1.

(1) First, as shown in FIG. 2, a field insulation layer (not shown) for element isolation is formed on the surface of a silicon substrate 10 in a specified region thereof by a selective oxidation method, and an insulation layer 12 is formed in the capacitor region 3000 in a specified region on the silicon substrate 10.

Then, in the memory region 2000, an insulation layer 20a formed from a silicon substrate layer is formed on the surface of the silicon substrate 10 by, for example, a thermal oxidation method. The insulation layer 20a becomes a gate insulation layer 20 of the memory transistor 200. The insulation layer 20a may preferably have a thickness of 5–20 nm in view of the gate dielectric strength and the like.

Then, a polysilicon layer 22a is formed on the surface of the insulation layer 20a that is formed from a silicon oxide layer by, for example, a CVD method. After having been subject to a process described below, the polysilicon layer 22a becomes a floating gate 22 (see FIG. 1) of the memory transistor 200. The polysilicon layer 22a may preferably be formed to have a film thickness of 100 nm to 200 nm.

Next, a stopper layer 50 comprising a silicon nitride layer is formed on the surface of the polysilicon layer 22a, and then a specified region of the stopper layer 50 is selectively etched and removed, using a resist layer R1 as a mask, to thereby form a groove 24a. The region of the stopper layer 50 that is removed corresponds to a region where a selective oxide insulation layer 24 of the memory transistor 200 is formed.

Then, an impurity such as phosphorous or arsenic is diffused in the polysilicon layer 22a, using the resist layer R1 formed on the stopper layer 50 as a mask, to form an N-type polysilicon layer 22a. The polysilicon layer may also be changed to N-type by other methods. For example, after the polysilicon layer is formed, phosphorous ions or arsenic ions are implanted in the polysilicon layer. Alternatively, after the polysilicon layer is formed, the polysilicon layer is brought into contact with a carrier gas containing phosphoryl chloride ($POCl_3$). Alternatively, when the polysilicon layer is formed, the layer is contacted with a carrier gas containing phosphine ($PH_3$).

Then, the resist layer R1 is removed.

Figure 3:
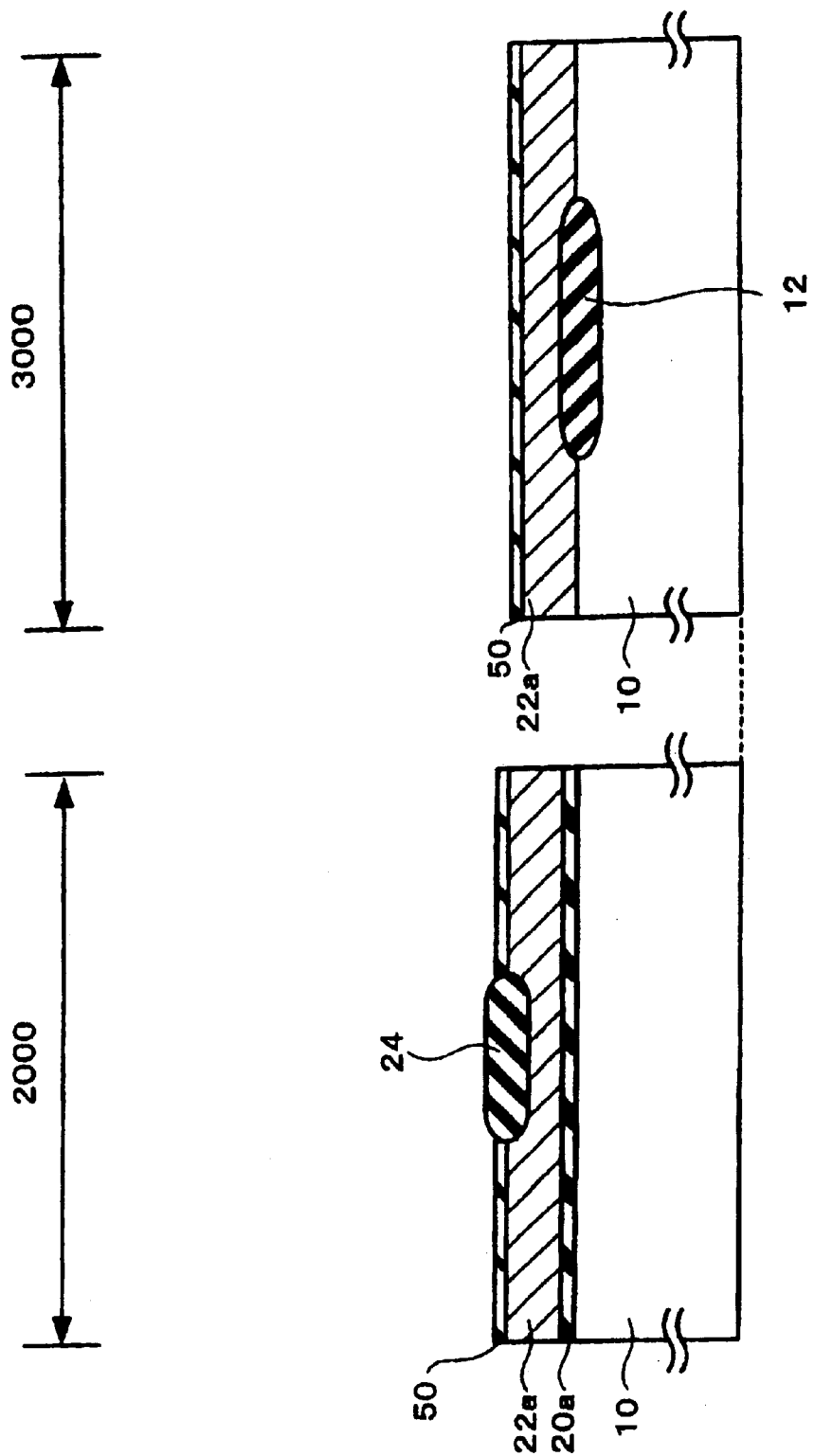
FIG. 3 shows a cross-sectional view of the memory region and the capacitor region in a manufacturing step of the semiconductor device shown in FIG. 1.

(2) Next, as shown in FIG. 3, an exposed portion in the polysilicon layer 22a is selectively oxidized to form a selective oxide insulation layer 24 on the surface of the polysilicon layer 22a in a specified region thereof. The selective oxide insulation layer 24 formed by the selective oxidation preferably has a structure in which it has a maximum film thickness at its central area, and gradually becomes thinner toward end sections thereof. The selective oxide insulation layer 24 may preferably have a film thickness of 100–200 nm at the thickest portion. Thereafter, the first stopper layer 50 is removed.

Figure 4:
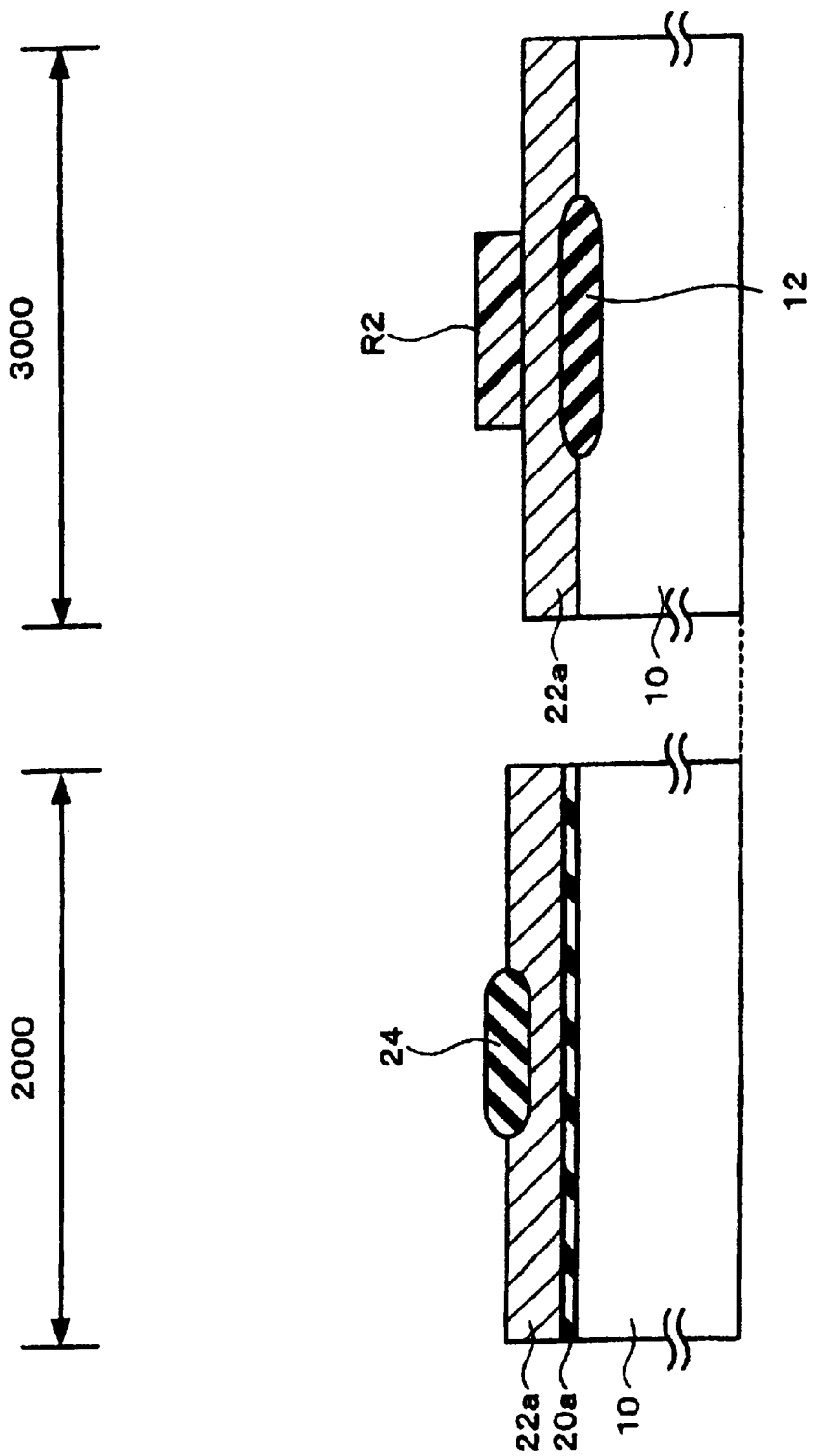
FIG. 4 shows a cross-sectional view of the memory region and the capacitor region in a manufacturing step of the semiconductor device shown in FIG. 1.
Figure 5:
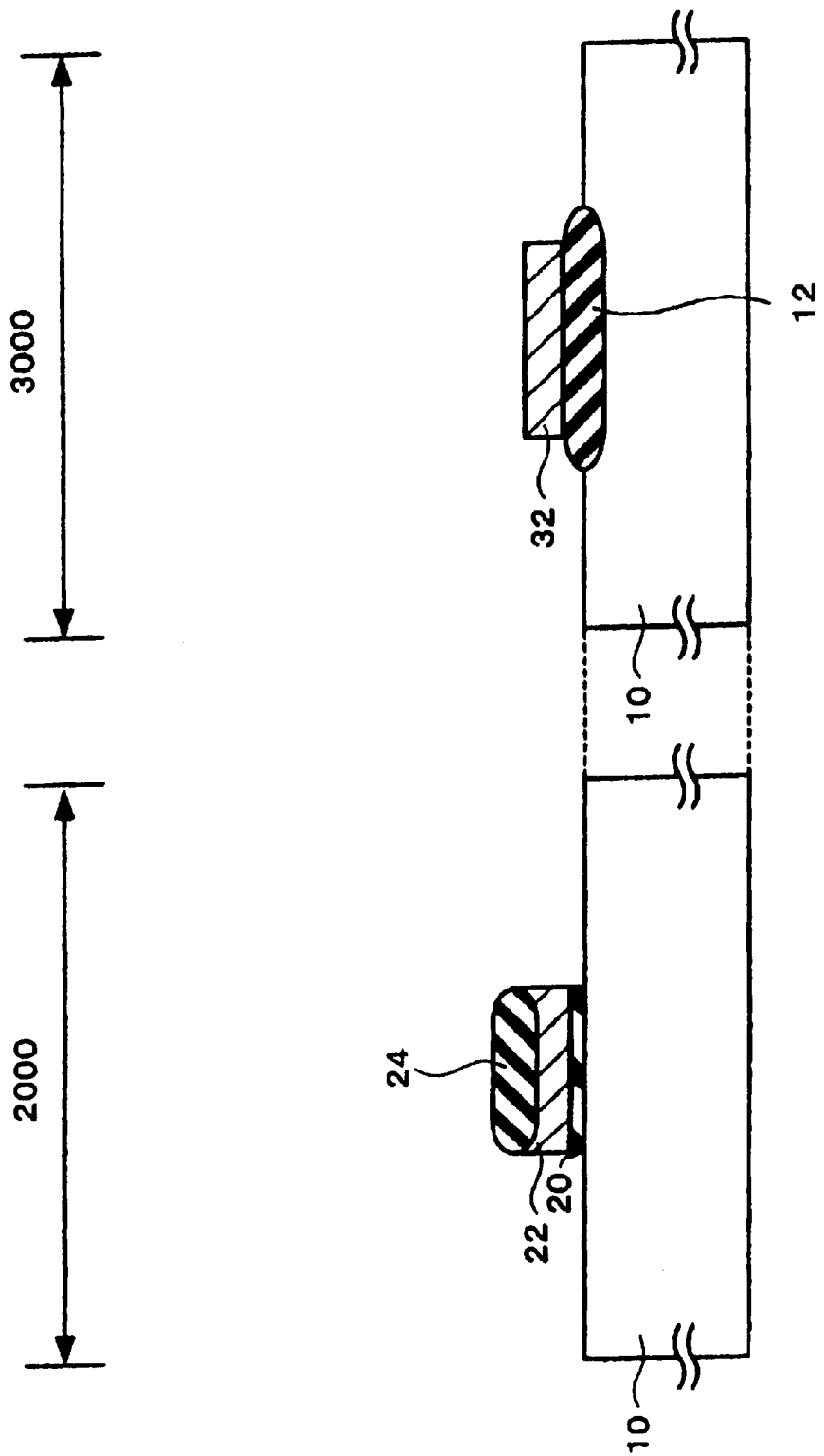
FIG. 5 shows a cross-sectional view of the memory region and the capacitor region in a manufacturing step of the semiconductor device shown in FIG. 1.

(3) Then, as shown in FIG. 4, in the capacitor region 3000, a resist layer (mask layer) R2 having a specified shape is formed on the surface of the polysilicon layer in a specified region thereof. The region where the resist layer R2 is formed on the polysilicon layer 22a is a region where a lower electrode 32 (see FIG. 5) of the capacitor 300 is formed in the succeeding steps. Then, an etching is conducted using the selective oxide insulation layer 24 in the memory region 2000 and the resist layer R2 in the capacitor region 3000 as masks to selectively remove the polysilicon layer 22a.

By the steps described above, as shown in FIG. 5, the gate insulation layer 20, the floating gate 22 and the selective oxide insulation layer 24 are formed in the memory region 2000, and the lower electrode 32 is formed in the capacitor region 3000.

Figure 6:
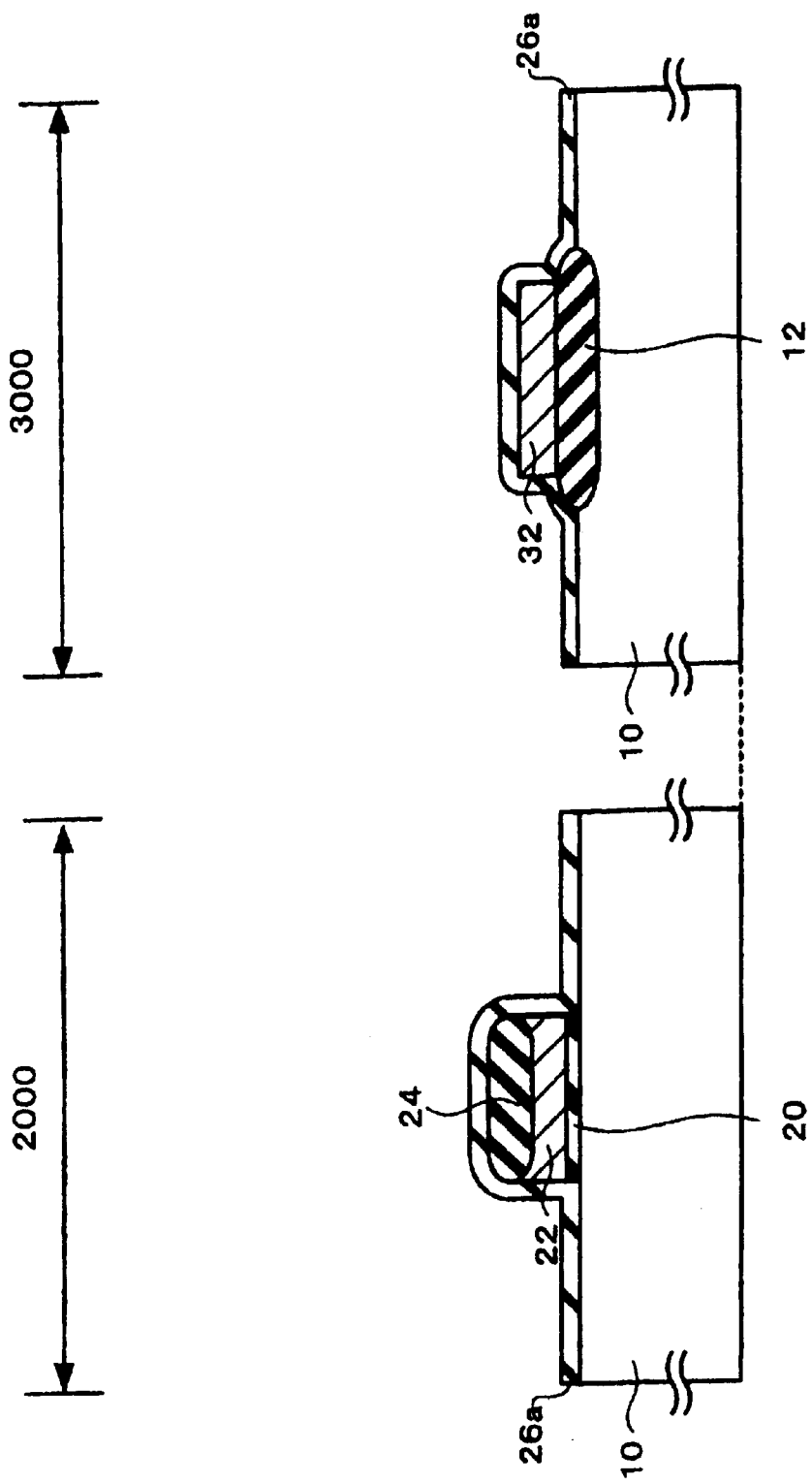
FIG. 6 shows a cross-sectional view of the memory region and the capacitor region in a manufacturing step of the semiconductor device shown in FIG. 1.

(4) Then, as shown in FIG. 6, a first silicon oxide layer 26a is formed by a thermal oxidation method. The first silicon oxide layer 26a is patterned into a specified shape in the succeeding steps to thereby form an intermediate insulation layer 26 (see FIG. 1) of the memory transistor 200.

The first silicon oxide layer 26a may be formed from a plurality of layers stacked in layers.

Also, the first silicon oxide layer 26a may be formed by any method, for example, a thermal oxidation method, a CVD method or a method combining these methods. A preferred CVD method is a high-temperature CVD method. Forming a silicon oxide layer by a high-temperature CVD method provides an advantage in that the film of the silicon oxide layer becomes dense. Alternatively, considering the density of the formed film and the permeability resistance against oxygen ions in the thermal oxidation to be conducted in the later step, the CVD method used in this embodiment may preferably be conducted by an HTO (high temperature oxide) method using monosilane and tetraethylorthosilicate, a TEOS (tetraethylorthosilicate) method using ozone as an oxidation agent or a plasma TEOS method.

The first silicon oxide layer 26a may preferably have a thickness of, for example, 20 nm to 25 nm, on the silicon substrate 10.

Next, depending on the requirements, the first silicon oxide layer 26a may be subjected to an annealing treatment. The annealing treatment can improve the film quality of the silicon oxide layer that is re-formed. The annealing treatment can be conducted in a nitrogen atmosphere under atmospheric pressure. Its temperature may be, for example, at 850° C. to 1000° C., and more preferably at 900° C. to 950° C. The annealing treatment time is, for example, 15 to 30 minutes, and more preferably 20 to 25 minutes.

In addition, in alternative embodiments, a wet-oxidation may be added to the annealing treatment described above, or a wet-oxidation may be conducted instead of the annealing treatment described above.

Figure 7:
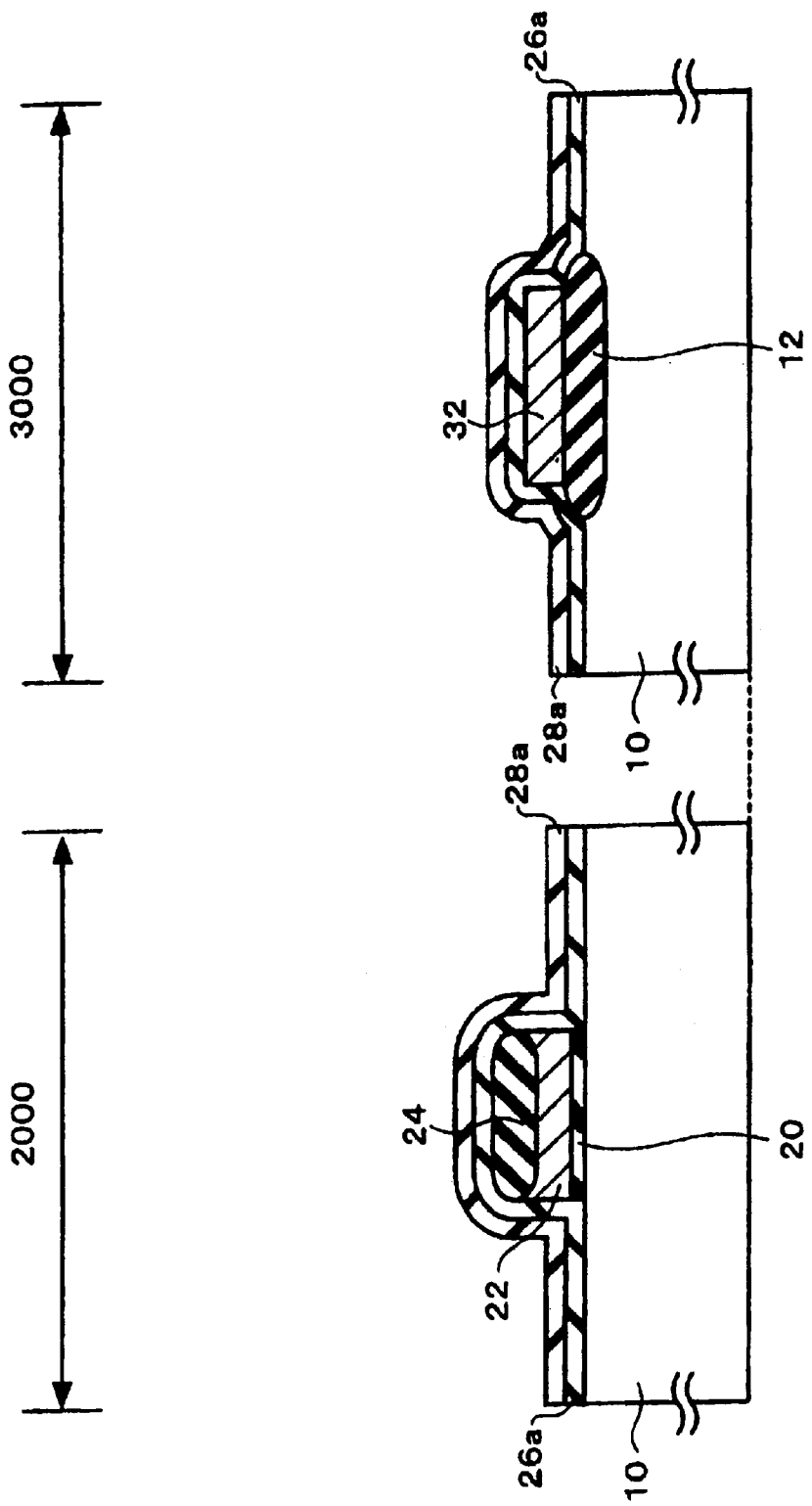
FIG. 7 shows a cross-sectional view of the memory region and the capacitor region in a manufacturing step of the semiconductor device shown in FIG. 1.

(5) Then, as shown in FIG. 7, a protection layer 28a for the memory region 2000 is formed on the first silicon oxide layer 26a by, for example, a CVD method or the like. In other words, the protection layer 28a functions as a protection layer to inhibit or prevent the memory transistor 200 including the floating gate 22 and the first silicon oxide layer 26a from deforming to thereby inhibit or prevent the characteristic of the memory transistor 200 from changing when a thermal oxidation step is conducted in a later step to form the dielectric layer 30 of the capacitor 300 by thermally oxidizing a part of the lower electrode 32. Here, the protection layer 28a is preferably formed from a silicon nitride layer. However, the protection layer 28a is not limited to a silicon nitride layer, and can be any layer that is useful as an oxidation prevention layer, which will be described below.

Figure 8:
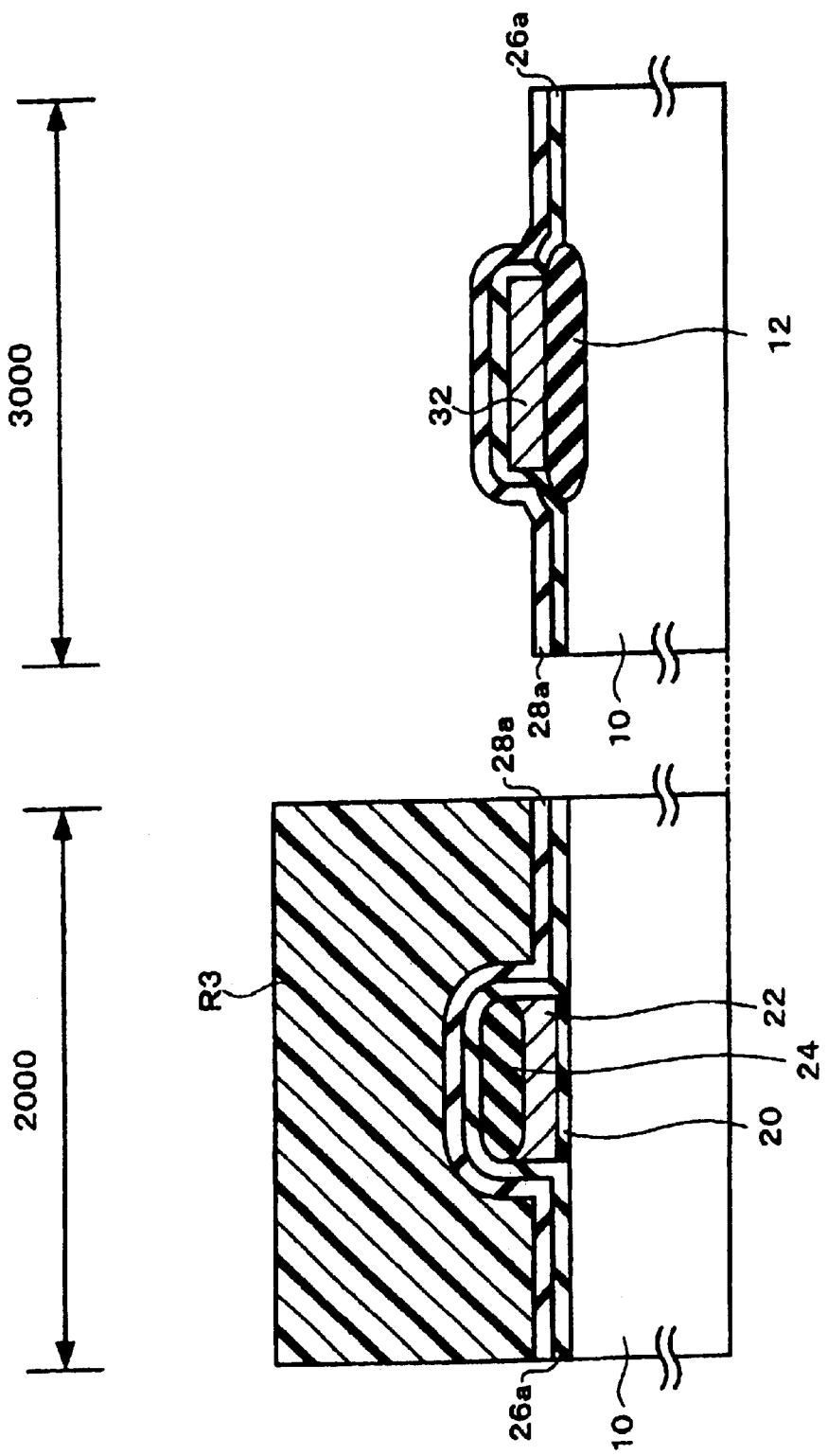
FIG. 8 shows a cross-sectional view of the memory region and the capacitor region in a manufacturing step of the semiconductor device shown in FIG. 1.
Figure 9:
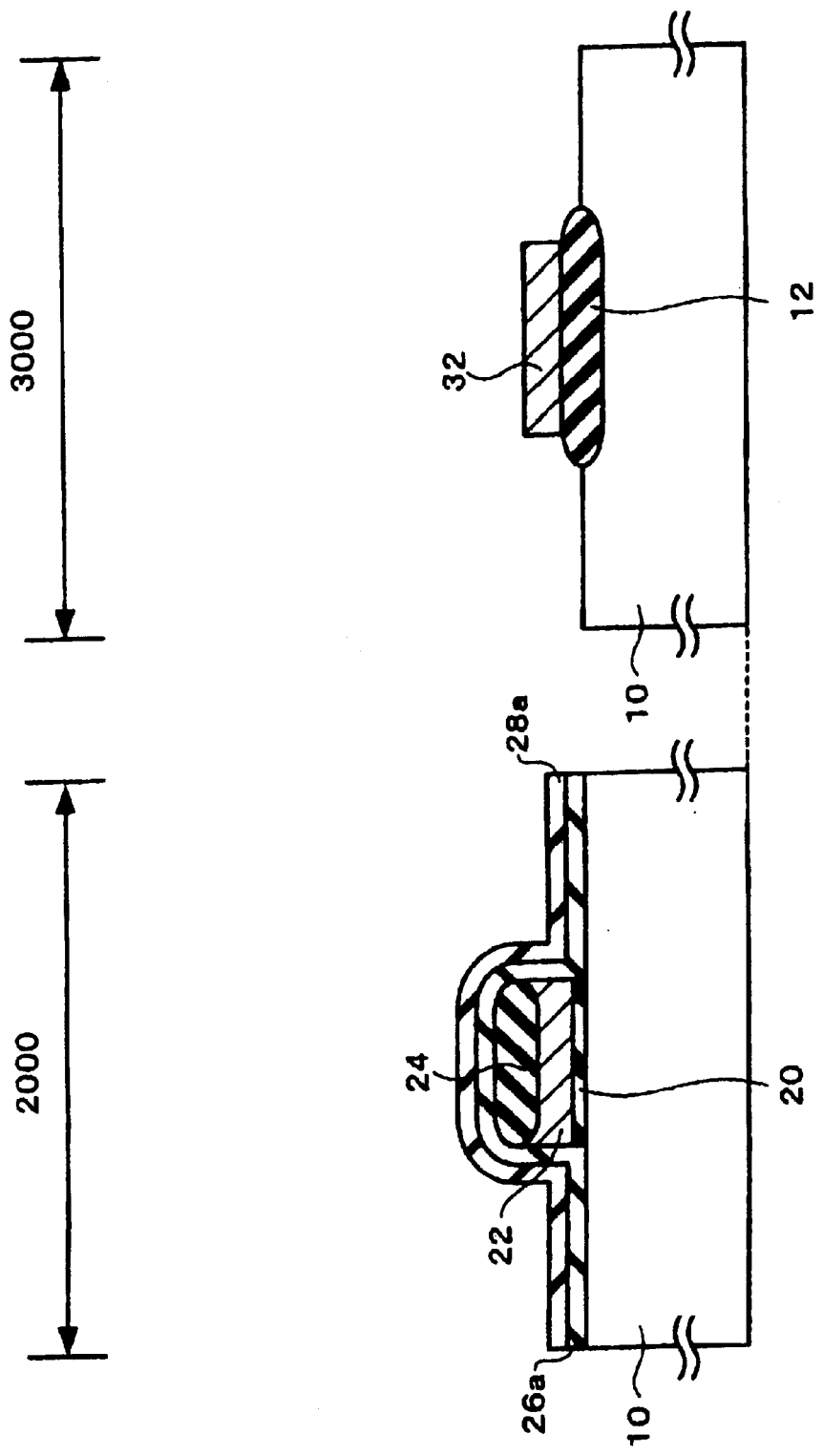
FIG. 9 shows a cross-sectional view of the memory region and the capacitor region in a manufacturing step of the semiconductor device shown in FIG. 1.

(6) Then, as shown in FIG. 8, in the memory region 2000, a resist layer (mask layer) R3 is formed on the protection layer 28a, and then an etching is conducted, such that, in the capacitor region 3000, the first silicon oxide layer 26a and the protection layer 28a are selectively removed. Then, the resist layer R3 is removed.

By the steps described above, as shown in FIG. 9, the first silicon oxide layer 26a and the protection layer 28a remain only in the memory region 2000, and the surface of the lower electrode 32 is exposed in the capacitor region 3000.

Figure 10:
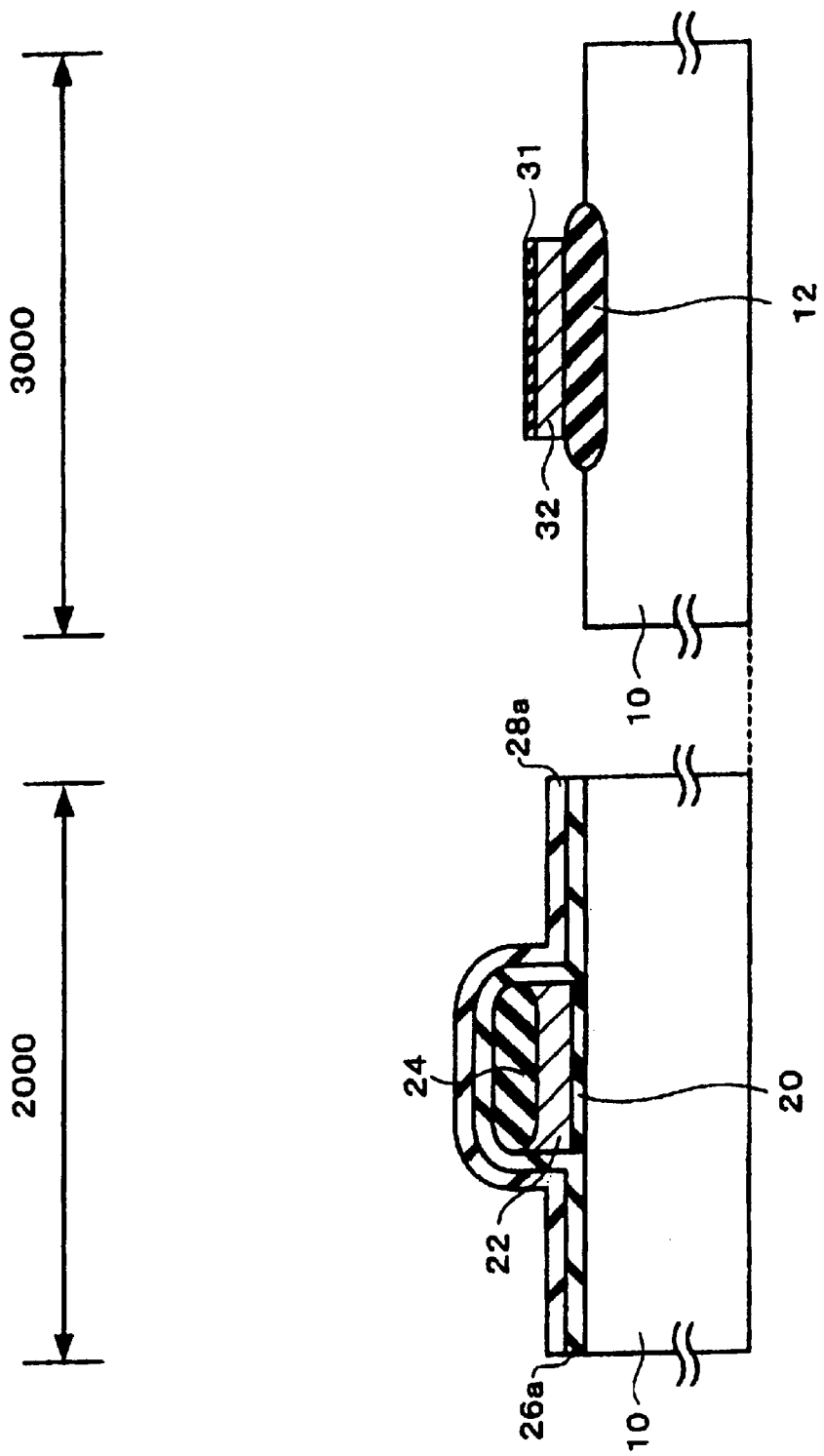
FIG. 10 shows a cross-sectional view of the memory region and the capacitor region in a manufacturing step of the semiconductor device shown in FIG. 1.

(7) Next, the upper surface of the lower electrode 32 formed in the capacitor region 3000 is thermally oxidized, to form an insulation layer 31 comprising a silicon oxide layer on the upper surface section of the lower electrode 32, as shown in FIG. 10. This insulation layer becomes a lower dielectric layer 31 of the dielectric layer 30 that forms the capacitor in later steps. In this step, the thermal oxidation may preferably be conducted at temperatures of 750° C. to 1100° C., and more preferably at 950° C. to 1000° C. such that components in the memory region 2000 and the capacitor region 3000 are not affected, and the insulation layer 31 is thinly and securely formed. Also, in the memory region 2000, the protection layer 28a is formed in an uppermost layer. Therefore, the shape of the first silicon oxide layer 26a and the selective oxide insulation layer 24 formed below the protection layer 28a can be inhibited or prevented from being deformed in the thermal oxidation step.

Figure 11:
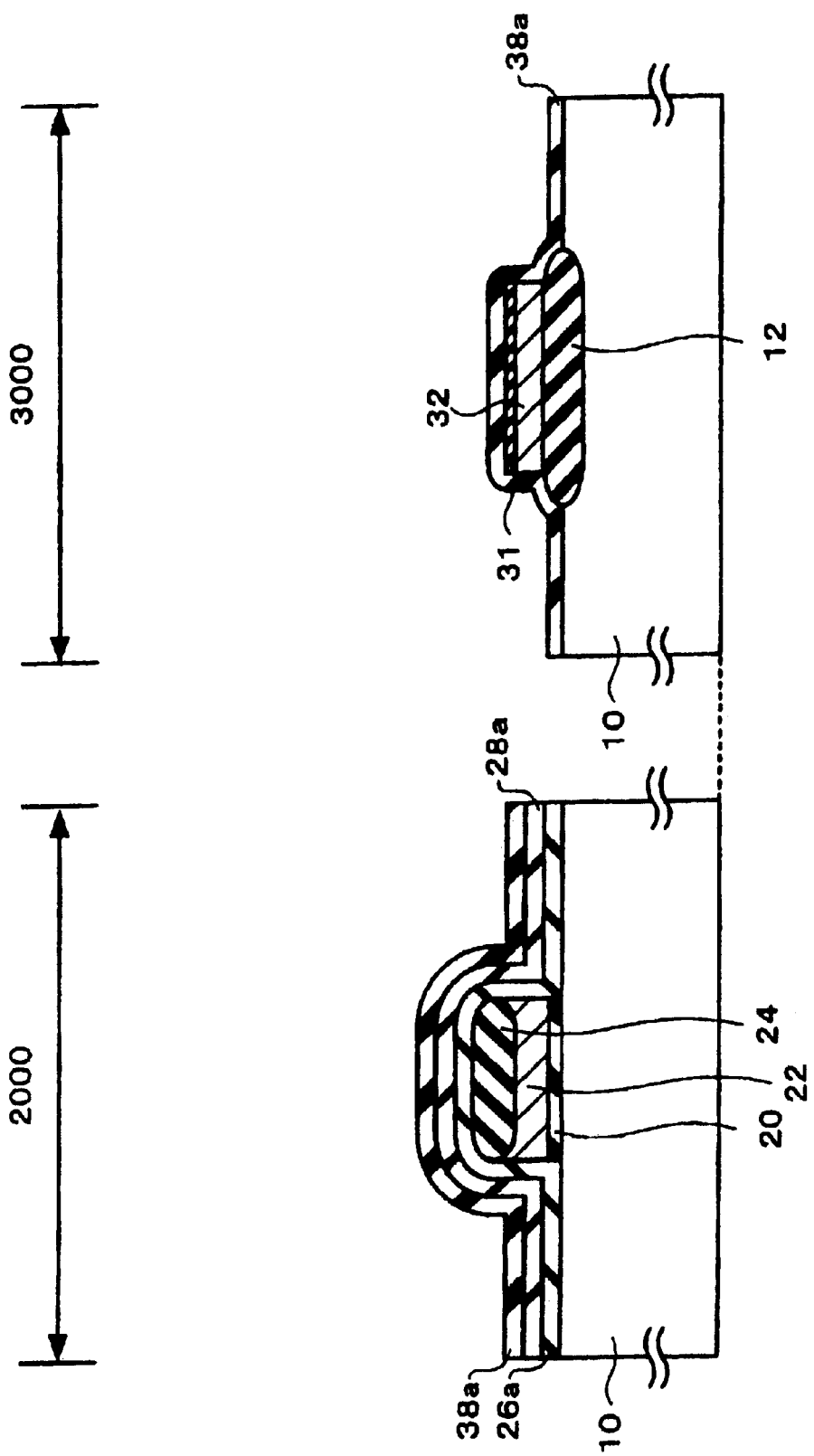
FIG. 11 shows a cross-sectional view of the memory region and the capacitor region in a manufacturing step of the semiconductor device shown in FIG. 1.

(8) Then, for example, a CVD method is used to successively deposit a silicon nitride layer 38a in layers, as shown in FIG. 11. The film thickness of the silicon nitride layer 38a is determined according to the desired properties. For example, when a capacitor design requires high capacitance, the silicon nitride layer may be formed to a narrow thickness. In certain embodiments, the silicon nitride layer is formed to a film thickness of 10 to 20 nm.

Figure 12:
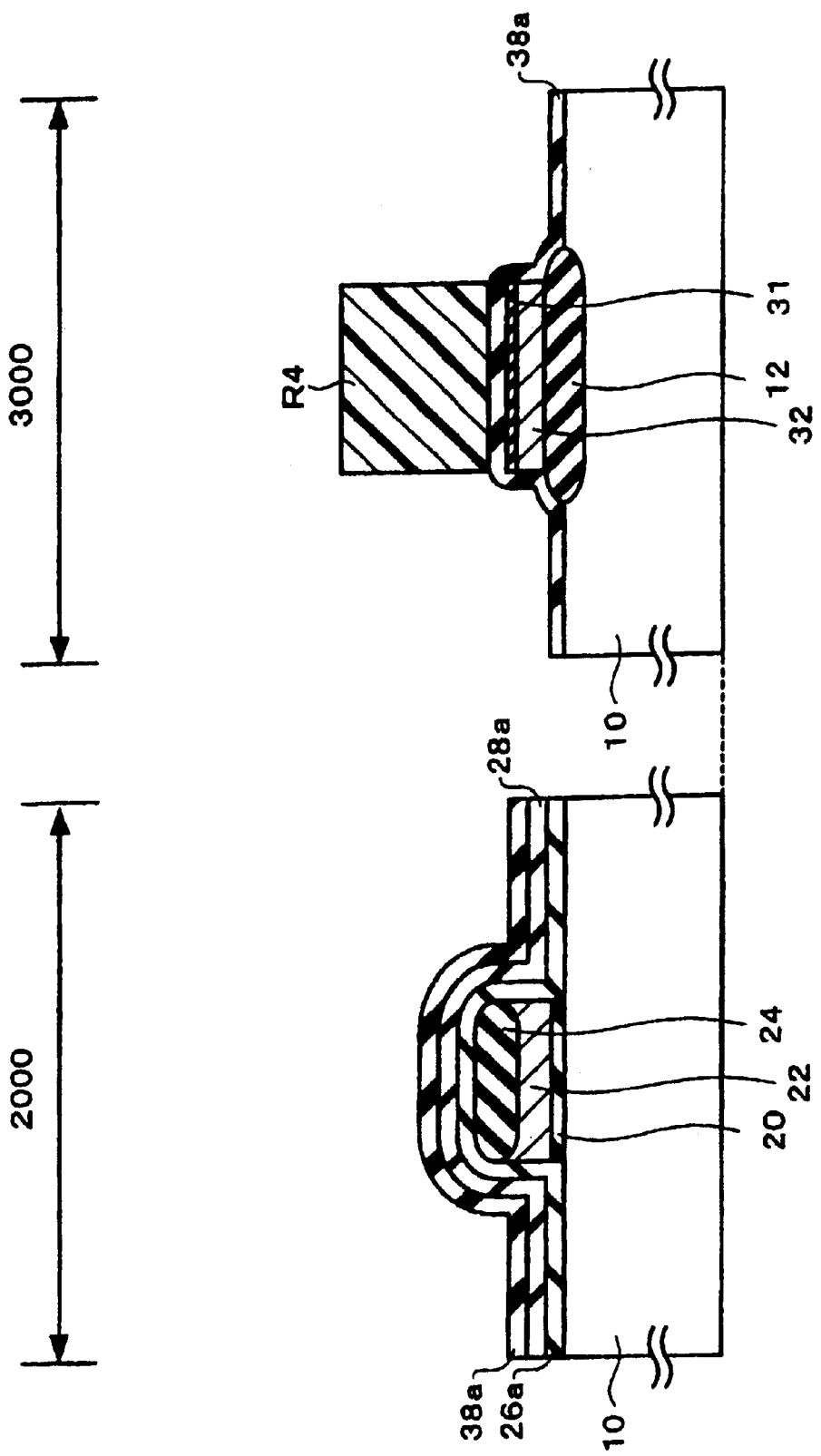
FIG. 12 shows a cross-sectional view of the memory region and the capacitor region in a manufacturing step of the semiconductor device shown in FIG. 1.
Figure 13:
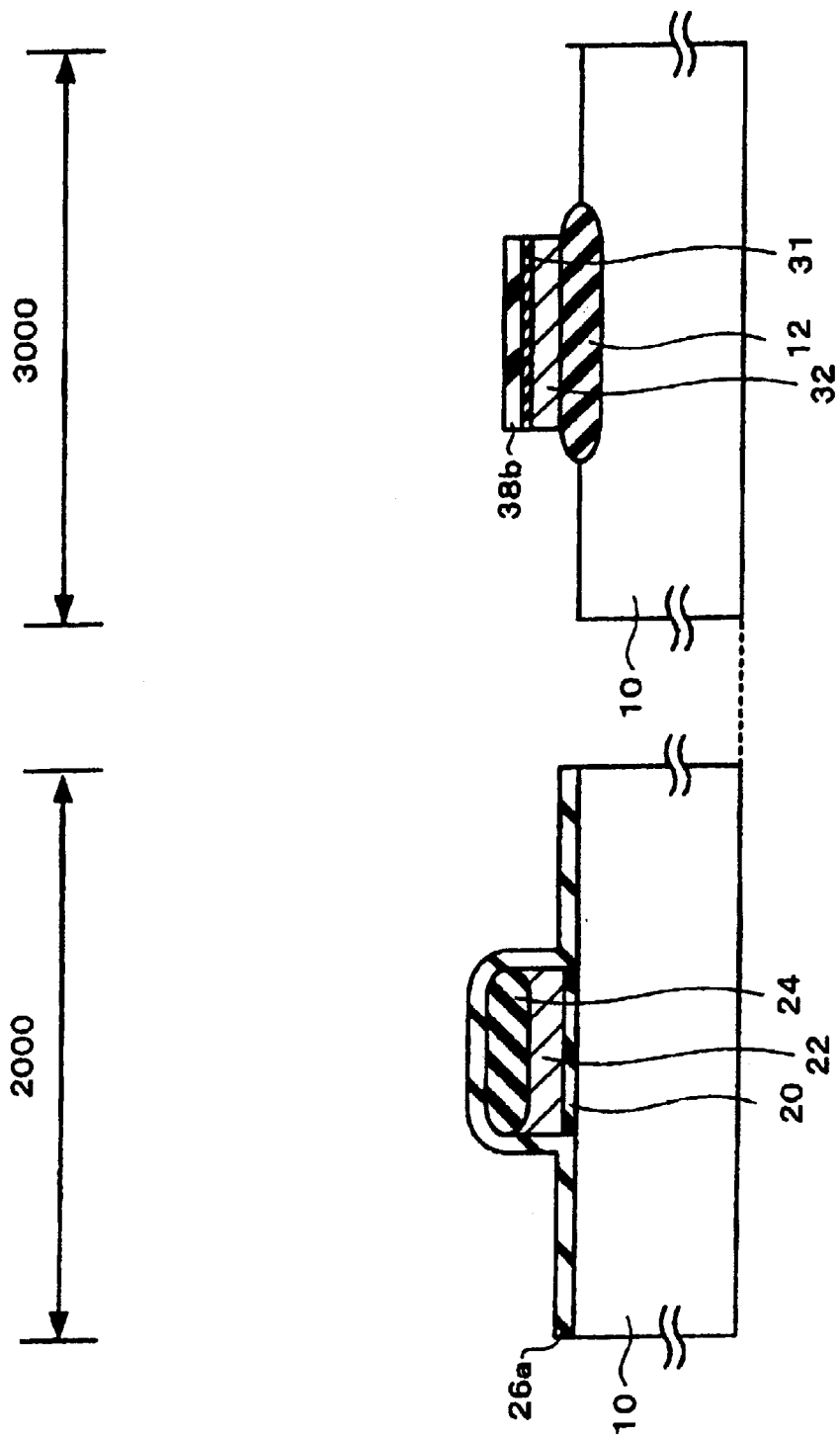
FIG. 13 shows a cross-sectional view of the memory region and the capacitor region in a manufacturing step of the semiconductor device shown in FIG. 1.

(9) Next, as shown in FIG. 12, in the capacitor region 3000, a resist layer (mask layer) R4 is formed in a specified region on the silicon nitride layer 38a and then an etching is conducted, such that the layers formed above the first silicon oxide layer 26a in the memory region 2000 are removed. In here, the specified region on the silicon nitride layer 38a is a region in the silicon nitride layer 38a where the lower electrode 32 and the insulation layer 31 are formed in lower layers. In this step, the protection layer 28a and the silicon nitride layer 38a in the memory region 2000 are selectively removed, and the silicon nitride layer 38a in the capacitor region 3000 is patterned into a specified shape, to thereby form a silicon nitride layer 38b on the insulation layer 31, as shown in FIG. 13. In this step, for example, a dry etching can be used as an etching method. Then, the resist layer R4 is removed.

By the steps described above, the silicon nitride layer 38a is removed and the first silicon oxide layer 26a is exposed in the memory region 2000, and the silicon nitride layer 38b is formed on the insulation layer 31 in the capacitor region 3000, as shown in FIG. 13.

Figure 14:
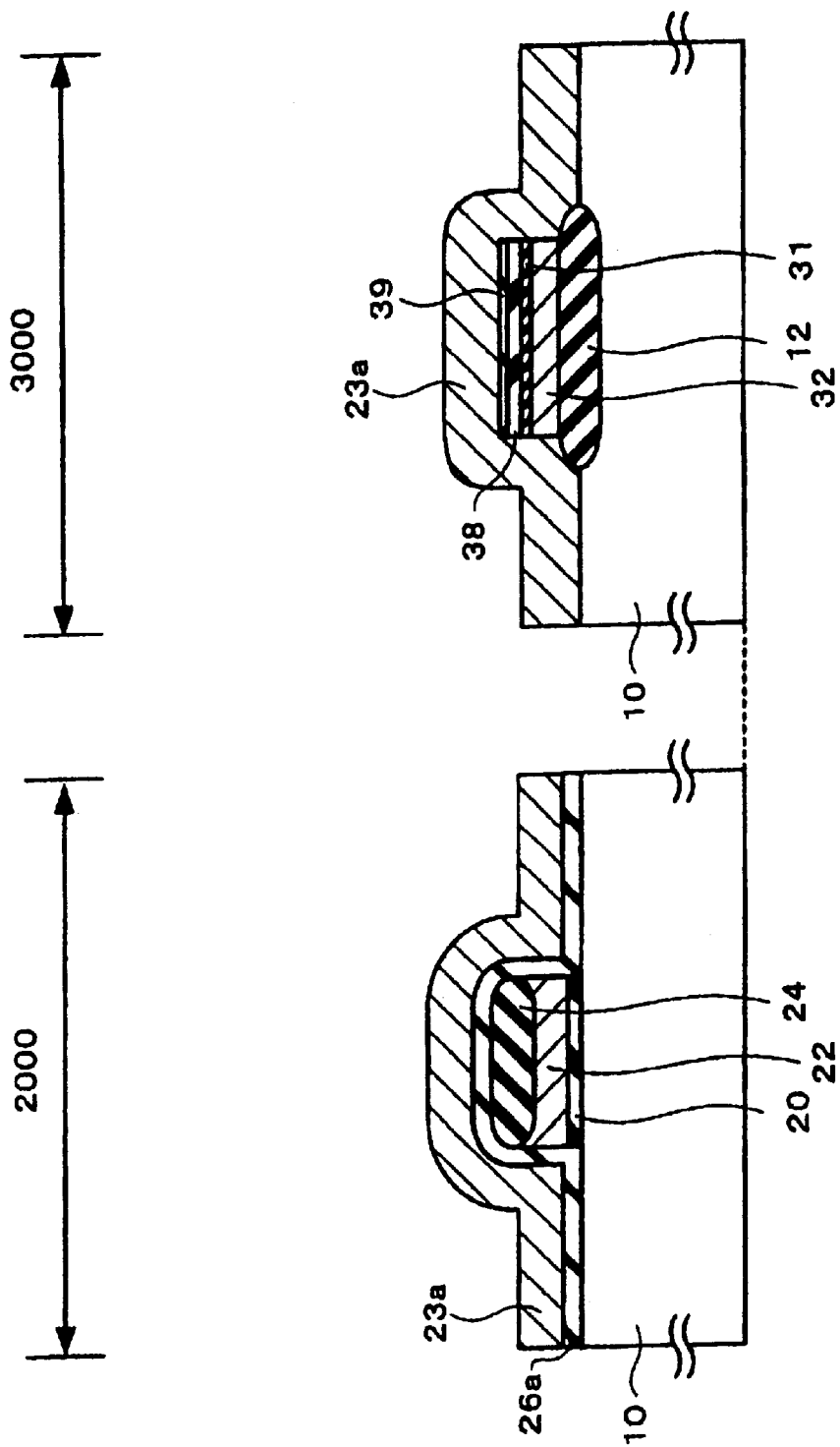
FIG. 14 shows a cross-sectional view of the memory region and the capacitor region in a manufacturing step of the semiconductor device shown in FIG. 1.

(10) Then, the surface of the silicon nitride layer 38b is oxidized to thereby form a second silicon oxide layer 39 at the same time when an oxidation is conducted to form an insulation layer for transistors (not shown) to be used for a circuit. In this step, as shown in FIG. 14, a portion of the silicon nitride layer 38b that remains without being oxidized becomes an intermediate dielectric layer 38, and the second silicon oxide layer 39 that is formed by the oxidation becomes an upper dielectric layer that forms the dielectric layer 30 in the capacitor region 3000. Then, as shown in FIG. 14, a polysilicon layer 23a is deposited on the first silicon oxide layer 26a formed in the memory region, the silicon substrate 10 formed in the capacitor region and the second silicon oxide layer 39 formed in the capacitor region. Alternatively, a polycide layer may be formed by a known method, instead of the polysilicon layer.

Figure 15:
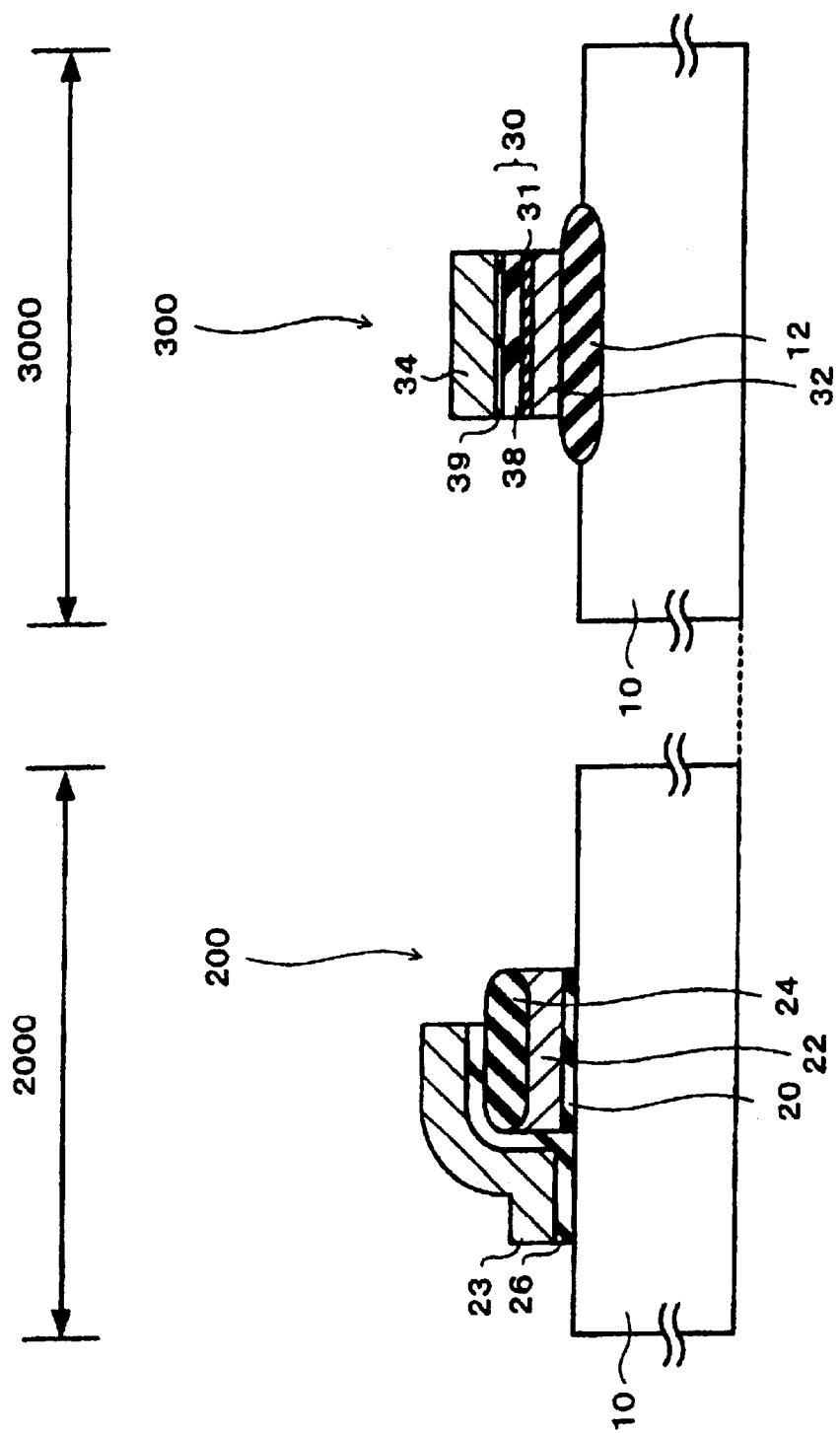
FIG. 15 shows a cross-sectional view of the memory region and the capacitor region in a manufacturing step of the semiconductor device shown in FIG. 1.

Then, a resist layer having a specified pattern is formed on the polysilicon layer 23a and patterned by an etching to thereby form a gate insulation layer 20 of the memory transistor 200 and an upper electrode 34 of the capacitor 300, as shown in FIG. 15. In this embodiment, the etching is preferably conducted in a manner that a silicon oxide layer having a film thickness of 1 nm to 5 nm remains on the exposed surface of the silicon substrate 10.

(11) Then, as shown in FIG. 1, an N-type impurity for an N-channel type transistor and a P-type impurity for a P-channel type transistor are doped in specified regions in the silicon substrate 10, respectively, to form impurity diffusion layers that form the source region 14 and the drain region 16, respectively.

Then, an interlayer dielectric layer 70 preferably comprising a silicon oxide layer is formed by, for example, a CVD method on the silicon substrate 10 where the memory transistor 200 and the capacitor 300 are formed. Then, specified regions of the interlayer dielectric layer 70 are selectively removed by an etching to form contact holes 81 and 83 that reach the source region 14 and the drain region 16, respectively. Then, a conduction layer comprising aluminum or the like is deposited over the top surface of the interlayer dielectric layer 70 and within the contact holes by, for example, a sputtering method. In this step, the conduction layer may be patterned, to form contact conduction layers 84 and 85 that fill the contact holes, and also form metal wiring layers (for example, bit lines and source lines) 80 and 82 that are electrically connected to the impurity diffusion layers.

By the manufacturing method described above, the memory region 2000 and the capacitor region 3000 can be formed through a series of steps. In other words, a semiconductor device that mix-mounts the memory transistor 200 with a split-gate structure and capacitor 300 can be manufactured with fewer steps.

Also, by the manufacturing method described above, the control gate 23 that forms the memory transistor 200 and the upper electrode 34 that forms the capacitor 300 can be formed in the same patterning step. Furthermore, the floating gate 22 that forms the memory transistor 200 and the lower electrode 32 that forms the capacitor 300 can be formed in the same patterning step. In this manner, the control gate 23 and the upper electrode 34 are formed in a common step, and the floating gate 22 and the lower electrode 32 are formed in a common step, such that the semiconductor device 1000 can be manufactured with fewer steps.

Also, in the manufacturing method described above, in steps (3) and (4), after the intermediate insulation layer (tunnel insulation layer) 26 and the selective oxide insulation layer 24 are formed, the protection layer 28a is formed. As a result, in a thermal oxidation step that is conducted in a later step, the influence of the thermal oxidation step upon the silicon oxide layer can be reduced because the first silicon oxide layer 26a and the selective oxide insulation layer 24 are covered and protected by the protection layer 28a.

In other words, the shape of the first silicon oxide layer 26a and the selective oxide insulation layer 24 can be inhibited or prevented from changing due to the thermal oxidation step, such that the effects on the flash memory characteristic can be reduced. In addition, since the intermediate insulation layer 26 with an excellent film characteristic can be obtained, a highly reliable memory characteristic can be realized.

Furthermore, because the thermal treatment (including also the thermal treatment in the oxidation process) is conducted in a state in which the protection layer 28a is formed on the first silicon oxide layer 26a, the silicon oxide layer that composes the intermediate insulation layer 26 is densified and the film quality of the silicon oxide layer is improved. As a result, its memory characteristic, particularly, the number of data writing and erasure (cycle life) can be improved.

Also, in a semiconductor device as described above, the floating gate that forms the non-volatile memory transistor and the lower electrode that forms the capacitor can be formed in the same film-forming step. As a result, the number of steps can be reduced, and the process can be simplified.

The present invention is not limited to the embodiments described above, and many modifications can be made within the subject matter of the present invention. For example, in an embodiment described above, the first conduction type is described to be an N-type, and the second conduction type is described to be a P-type. However, they can be replaced with one another in each semiconductor layer without departing the subject matter of the present invention. In other words, the actions and effects of the present invention can be achieved when the first conduction type is a P-type and the second conduction type is an N-type.

Also, depending on the requirements, a triple-well, in which an N-type impurity (for example, arsenic or phosphorous) is diffused in the silicon substrate 10 to form an N-type first well, and further, a P-type impurity (for example, boron) is doped in the first well to form a P-type second well in a specified region, can be used.

What is claimed:

1. A method for manufacturing a semiconductor device including a memory region including a non-volatile memory transistor with a split gate structure, and a capacitor region including a capacitor, the method for manufacturing a semiconductor device comprising the steps of:

(a) forming, in the memory region, a gate insulation layer, a floating gate, and a selective oxide insulation layer on a semiconductor substrate, which comprise a portion of the non-volatile memory transistor;

(b) forming, in the capacitor region, a lower electrode that comprises a portion of the capacitor on an insulation layer formed on the semiconductor substrate;

(c) successively depositing in layers a first silicon oxide layer and a protection layer, and then removing, in the capacitor region, the first silicon oxide layer and the protection layer deposited over the lower electrode;

(d) forming, in the capacitor region, an insulation layer by thermally oxidizing an upper surface section of the lower electrode;

(e) depositing a silicon nitride layer, and then removing the protection layer and the silicon nitride layer in the memory region, and patterning the silicon nitride layer in the capacitor region;

(f) forming an intermediate insulation layer and a control gate that comprise a portion of the non-volatile memory transistor, and forming a dielectric layer and an upper electrode that comprise a portion of the capacitor, wherein the control gate and upper electrode are formed by forming and then patterning a conduction layer, wherein the intermediate insulation layer is formed by patterning the first silicon oxide layer, and wherein the dielectric layer is formed between the upper electrode and the lower electrode; and (g) forming an impurity diffusion layer by introducing an impurity in a specified region in the semiconductor substrate.

2. A method for manufacturing a semiconductor device according to claim 1, wherein, in said step (f), the control gate that forms a portion of the non-volatile memory transistor and the upper electrode that forms a portion of the capacitor are formed in a common patterning step.

3. A method for manufacturing a semiconductor device according to claim 1, wherein, in said steps (a) and (b), the floating gate that forms a portion of the non-volatile memory transistor and the lower electrode that forms a portion of the capacitor are formed in a common patterning step.

4. A method for manufacturing a semiconductor device according to claim 1, wherein, in said step (d), the thermal oxidation is conducted at 700° C. to 1100° C. to form the insulation layer, wherein the insulation layer comprises a silicon oxide layer.

5. A method for manufacturing a semiconductor device according to claim 1, wherein, in said step (f), when the conduction layer is formed, an upper surface section of the silicon nitride layer is oxidized to form a second silicon oxide layer.

6. A method for manufacturing a semiconductor device according to claim 5, wherein the dielectric layer includes a lower dielectric layer, an intermediate dielectric layer and an upper dielectric layer, the lower dielectric layer comprising a silicon oxide layer that is formed in said step (d), the intermediate dielectric layer comprising the silicon nitride layer that is formed in said step (e), and the upper dielectric layer comprising the second silicon oxide layer that is formed in said step (f).

7. A method for manufacturing a semiconductor device according to claim 1, wherein said step (c) further comprises forming a mask layer on the protection layer in the memory region and then removing the first silicon oxide layer and the protection layer in the capacitor region.

8. A method for manufacturing a semiconductor device according to claim 7, wherein said step (e) further comprises forming a mask layer in a specified region of the silicon nitride layer in the capacitor region, and then removing the protection layer and the silicon nitride layer in the memory region and patterning the silicon nitride layer in the capacitor region into a specified pattern.

9. A method for manufacturing a semiconductor device according to claim 1, wherein the protection layer comprises a silicon nitride layer.

10. A method for manufacturing a semiconductor device including a non-volatile memory transistor according to claim 9, wherein, in said step (c), the protection layer is formed to a thickness of 5 nm to 20 nm.

11. A method for manufacturing a semiconductor device according to claim 1, further including the step of forming a flash memory.

12. A method for manufacturing a semiconductor device according to claim 11, further including the step of forming another circuit region separate from and mix-mounted on a substrate with the memory region.

13. A method for manufacturing a semiconductor device according to claim 12, wherein the another circuit includes at least one circuit selected from the group consisting of an A-D converter, a D-A converter, a comparator, an operation amplifier and a power supply IC, and wherein the capacitor is included in the at least one circuit.

14. A method for manufacturing a semiconductor device comprising a memory region including a non-volatile memory transistor with a split gate structure, and a capacitor region including a capacitor, the method comprising:

forming a gate insulation layer, a floating gate, and a selective oxide insulation layer on a semiconductor substrate in the memory region;

forming a lower electrode that comprises a portion of the capacitor on an insulation layer formed on the semiconductor substrate in the capacitor region;

forming, a first silicon oxide layer and a protection layer on the memory region;

forming, in the capacitor region, an insulation layer by thermally oxidizing an upper surface section of the lower electrode;

depositing a silicon nitride layer on the memory region and the capacitor region, and then removing the protection layer and the silicon nitride layer in the memory region, and patterning the silicon nitride layer into a specified shape in the capacitor region;

forming an intermediate insulation layer and a control gate that comprise a portion of the non-volatile memory transistor, and forming a dielectric layer and an upper electrode that comprise a portion of the capacitor, wherein the control gate and upper electrode are formed by forming and then patterning a conduction layer, wherein the intermediate insulation layer is formed by patterning the first silicon oxide layer, and wherein the dielectric layer is formed between the upper electrode and the lower electrode; and forming an impurity diffusion layer by introducing an impurity in a specified region in the semiconductor substrate.

15. A method for manufacturing a semiconductor device as in claim 1, wherein the dielectric layer formed between the upper electrode and the lower electrode comprises a silicon oxide layer formed by oxidizing the silicon nitride layer in the capacitor region.

16. A method as in claim 14, wherein the dielectric layer that comprises a portion of the capacitor comprises a silicon oxide layer formed by oxidizing the silicon nitride layer in the capacitor region.

17. A method for manufacturing a semiconductor device comprising:

forming, in a memory region, a gate insulation layer on a first portion of a semiconductor substrate, a floating gate on the gate insulation layer, and a selective oxide insulation layer on the floating gate;

forming, in a capacitor region, an insulation layer and a lower electrode on a second portion of the semiconductor substrate;

forming, in the memory region, an intermediate insulation layer extending above the floating gate;

thermally oxidizing an upper surface section of the lower electrode to form a first capacitor dielectric layer on the lower electrode;

forming a second capacitor dielectric layer by forming a silicon nitride layer on the first capacitor dielectric layer on the lower electrode in the capacitor region and also forming the silicon nitride layer over the intermediate insulation layer in the memory region;

oxidizing an upper surface section of the silicon nitride layer in the capacitor region to form a third capacitor dielectric layer; and forming a conducting layer over the intermediate insulation layer and the third capacitor dielectric layer and patterning the conducting layer to form a control gate in the memory region and an upper electrode in the capacitor region;

wherein the silicon nitride layer over the intermediate insulation layer in the memory region is removed prior to forming the conducting layer over the intermediate insulation layer.

18. A method as in claim 17, wherein forming the intermediate insulation layer comprises forming a silicon oxide film by thermal oxidation, and forming a silicon oxide film by chemical vapor deposition, wherein the silicon oxide film formed by chemical vapor deposition is formed in direct contact with the silicon oxide film formed by thermal oxidation.

19. A method as in claim 17, wherein the floating gate and the lower electrode are formed in a common processing step.

* * * * *